(12) United States Patent
Telefus

(10) Patent No.: US 10,985,548 B2
(45) Date of Patent: Apr. 20, 2021

(54) CIRCUIT INTERRUPTER WITH OPTICAL CONNECTION

(71) Applicant: Intelesol, LLC, Danville, CA (US)

(72) Inventor: Mark Telefus, Orinda, CA (US)

(73) Assignee: Intelesol, LLC, Danville, CA (US)

( * ) Notice: Subject to any disclaimer, the term of this patent is extended or adjusted under 35 U.S.C. 154(b) by 160 days.

(21) Appl. No.: 16/149,094

(22) Filed: Oct. 1, 2018

(65) Prior Publication Data
US 2020/0106259 A1 Apr. 2, 2020

(51) Int. Cl.
*H02H 3/10* (2006.01)
*H02H 1/00* (2006.01)
*H02H 9/02* (2006.01)
*H03K 17/687* (2006.01)

(52) U.S. Cl.
CPC .......... *H02H 3/105* (2013.01); *H02H 1/0007* (2013.01); *H02H 1/00* (2013.01); *H02H 3/10* (2013.01); *H02H 9/02* (2013.01); *H02H 9/025* (2013.01); *H03K 17/687* (2013.01)

(58) Field of Classification Search
USPC ............................................. 361/42–50, 91.1
See application file for complete search history.

(56) References Cited

U.S. PATENT DOCUMENTS

| | | |
|---|---|---|
| 3,638,102 A | 1/1972 | Pelka |
| 3,777,253 A | 12/1973 | Callan |
| 4,074,345 A | 2/1978 | Ackermann |
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |

(Continued)

FOREIGN PATENT DOCUMENTS

| | | |
|---|---|---|
| EP | 0016646 A1 | 10/1980 |
| EP | 0398026 A2 | 11/1990 |

(Continued)

OTHER PUBLICATIONS

PCT/US19/54102, WO, Feb. 10, 2020, International Search Report and Written Opinion.

(Continued)

*Primary Examiner* — Danny Nguyen
(74) *Attorney, Agent, or Firm* — Ryan, Mason & Lewis, LLP

(57) ABSTRACT

Circuit interrupter positioned between supply circuit and load circuit includes fault detection circuit that senses wave forms to the load circuit, fault processing circuit that detects presence of fault and generates fault output signal when fault detected, and control circuit switch connected to fault processing signal output, wherein control circuit switch is opened by presence of fault output signal, thus isolating load circuit from supply circuit. Preferably fault processing circuit and control circuit are optically linked, such that when fault is detected, control circuit switch is opened by optical fault output signal, thus isolating load circuit from the supply circuit. Circuit interrupter may couple another circuit interrupter via power distribution control unit, optionally manageable remotely via automated control interface.

20 Claims, 7 Drawing Sheets

(56) References Cited

U.S. PATENT DOCUMENTS

| | | |
|---|---|---|
| 4,636,907 A | 1/1987 | Howell |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,760,293 A | 7/1988 | Hebenstreit |
| 4,766,281 A | 8/1988 | Buhler |
| 4,812,995 A | 3/1989 | Girgis et al. |
| 4,888,504 A | 12/1989 | Kinzer |
| 5,121,282 A | 6/1992 | White |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,870,009 A | 2/1999 | Serpinet et al. |
| 5,933,305 A | 8/1999 | Schmalz et al. |
| 6,081,123 A | 6/2000 | Kasbarian et al. |
| 6,111,494 A | 8/2000 | Fischer et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,369,554 B1 | 4/2002 | Aram |
| 6,483,290 B1 | 11/2002 | Hemminger et al. |
| 6,515,434 B1 | 2/2003 | Biebl |
| 6,538,906 B1 | 3/2003 | Ke et al. |
| 6,756,998 B1 | 6/2004 | Bilger |
| 6,788,512 B2 | 9/2004 | Vicente et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,164,238 B2 | 1/2007 | Kazanov et al. |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,610,616 B2 | 10/2009 | Masuouka et al. |
| 7,633,727 B2 | 12/2009 | Zhou et al. |
| 7,643,256 B2 | 1/2010 | Wright et al. |
| 7,693,670 B2 | 4/2010 | Durling et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,781,637 B2 * | 7/2014 | Eaves .................. H02J 3/12 361/42 |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,055,641 B2 | 6/2015 | Shteynberg et al. |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 | 12/2016 | Telefus et al. |
| 9,577,420 B2 | 2/2017 | Ostrovsky et al. |
| 9,621,053 B1 | 4/2017 | Telefus |
| 9,774,182 B2 | 9/2017 | Phillips |
| 9,836,243 B1 | 12/2017 | Chanler et al. |
| D814,424 S | 4/2018 | DeCosta |
| 9,965,007 B2 | 5/2018 | Amelio et al. |
| 9,990,786 B1 | 6/2018 | Ziraknejad |
| 9,991,633 B2 | 6/2018 | Robinet |
| 10,072,942 B2 | 9/2018 | Wootton et al. |
| 10,101,716 B2 | 10/2018 | Kim |
| 10,187,944 B2 | 1/2019 | MacAdam et al. |
| 10,469,077 B2 | 11/2019 | Telefus et al. |
| D879,056 S | 3/2020 | Telefus |
| D881,144 S | 4/2020 | Telefus |
| 10,615,713 B2 | 4/2020 | Telefus et al. |
| 10,756,662 B2 | 8/2020 | Steiner et al. |
| 10,812,072 B2 | 10/2020 | Telefus et al. |
| 10,812,282 B2 | 10/2020 | Telefus et al. |
| 10,819,336 B2 | 10/2020 | Telefus et al. |
| 2002/0109487 A1 | 8/2002 | Telefus et al. |
| 2003/0052544 A1 | 3/2003 | Yamamoto et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0162139 A1 | 7/2005 | Hirst |
| 2005/0185353 A1 | 8/2005 | Rasmussen et al. |
| 2006/0285366 A1 | 12/2006 | Radecker et al. |
| 2007/0008747 A1 | 1/2007 | Soldano et al. |
| 2007/0143826 A1 | 6/2007 | Sastry et al. |
| 2007/0159745 A1 | 7/2007 | Berberich et al. |
| 2007/0188025 A1 | 8/2007 | Keagy et al. |
| 2007/0236152 A1 | 10/2007 | Davis et al. |
| 2008/0136581 A1 | 6/2008 | Heilman et al. |
| 2008/0151444 A1 * | 6/2008 | Upton .................. H02H 7/0833 361/31 |
| 2008/0180866 A1 | 7/2008 | Wong |
| 2008/0204950 A1 | 8/2008 | Zhou et al. |
| 2008/0253153 A1 | 10/2008 | Wu et al. |
| 2008/0281472 A1 | 11/2008 | Podgorny et al. |
| 2009/0067201 A1 | 3/2009 | Cai |
| 2009/0168273 A1 | 7/2009 | Yu et al. |
| 2009/0203355 A1 | 8/2009 | Clark |
| 2009/0213629 A1 | 8/2009 | Liu et al. |
| 2009/0284385 A1 | 11/2009 | Tang et al. |
| 2010/0091418 A1 | 4/2010 | Xu |
| 2010/0145479 A1 | 6/2010 | Griffiths |
| 2010/0156369 A1 | 6/2010 | Kularatna et al. |
| 2010/0188054 A1 | 7/2010 | Asakura et al. |
| 2010/0231135 A1 | 9/2010 | Hum et al. |
| 2010/0231373 A1 | 9/2010 | Romp |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0320840 A1 | 12/2010 | Fridberg |
| 2011/0062936 A1 * | 3/2011 | Bartelous .................. H02H 3/066 323/312 |
| 2011/0121752 A1 | 5/2011 | Newman, Jr. et al. |
| 2011/0156610 A1 | 6/2011 | Ostrovsky et al. |
| 2011/0273103 A1 | 11/2011 | Hong |
| 2011/0292703 A1 | 12/2011 | Cuk |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0089266 A1 | 4/2012 | Tomimbang et al. |
| 2012/0095605 A1 | 4/2012 | Tran |

(56) References Cited

U.S. PATENT DOCUMENTS

| | | |
|---|---|---|
| 2012/0133289 A1 | 5/2012 | Hum et al. |
| 2012/0275076 A1 | 11/2012 | Shono |
| 2013/0051102 A1 | 2/2013 | Huang et al. |
| 2013/0057247 A1 | 3/2013 | Russell et al. |
| 2013/0066478 A1 | 3/2013 | Smith |
| 2013/0088160 A1 | 4/2013 | Chai et al. |
| 2013/0119958 A1 | 5/2013 | Gasperi |
| 2013/0170261 A1 | 7/2013 | Lee et al. |
| 2013/0253898 A1 | 9/2013 | Meagher et al. |
| 2013/0261821 A1 | 10/2013 | Lu et al. |
| 2013/0300534 A1 | 11/2013 | Myllymaki |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0074730 A1 | 3/2014 | Arensmeier et al. |
| 2014/0085940 A1 | 3/2014 | Lee et al. |
| 2014/0096272 A1 | 4/2014 | Makofsky et al. |
| 2014/0097809 A1 | 4/2014 | Follic et al. |
| 2014/0159593 A1 | 6/2014 | Chu et al. |
| 2014/0246926 A1 | 9/2014 | Cruz et al. |
| 2014/0266698 A1 | 9/2014 | Hall et al. |
| 2014/0268935 A1 | 9/2014 | Chiang |
| 2014/0276753 A1 | 9/2014 | Wham et al. |
| 2015/0042274 A1 | 2/2015 | Kim et al. |
| 2015/0055261 A1* | 2/2015 | Lubicki ............... H02H 9/04 |
| | | 361/91.1 |
| 2015/0097430 A1 | 4/2015 | Scruggs |
| 2015/0155789 A1 | 6/2015 | Freeman et al. |
| 2015/0180469 A1 | 6/2015 | Kim |
| 2015/0256355 A1 | 9/2015 | Pera et al. |
| 2015/0256665 A1 | 9/2015 | Pera et al. |
| 2015/0282223 A1 | 10/2015 | Wang et al. |
| 2015/0309521 A1 | 10/2015 | Pan |
| 2015/0317326 A1 | 11/2015 | Bandarupalli et al. |
| 2015/0355649 A1 | 12/2015 | Ovadia |
| 2015/0362927 A1 | 12/2015 | Giorgi |
| 2016/0018800 A1 | 1/2016 | Gettings et al. |
| 2016/0035159 A1 | 2/2016 | Ganapathy Achari et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0110154 A1 | 4/2016 | Qureshi et al. |
| 2016/0126031 A1 | 5/2016 | Wootton et al. |
| 2016/0181941 A1 | 6/2016 | Gratton et al. |
| 2016/0195864 A1 | 7/2016 | Kim |
| 2016/0247799 A1 | 8/2016 | Stafanov et al. |
| 2016/0277528 A1 | 9/2016 | Guilaume et al. |
| 2016/0294179 A1 | 10/2016 | Kennedy et al. |
| 2016/0360586 A1 | 12/2016 | Yang et al. |
| 2016/0374134 A1 | 12/2016 | Kweon et al. |
| 2017/0004948 A1 | 1/2017 | Leyh |
| 2017/0019969 A1 | 1/2017 | O'Neil et al. |
| 2017/0026194 A1 | 1/2017 | Vijayrao et al. |
| 2017/0033942 A1 | 2/2017 | Koeninger |
| 2017/0063225 A1 | 3/2017 | Guo et al. |
| 2017/0099647 A1 | 4/2017 | Shah et al. |
| 2017/0170730 A1 | 6/2017 | Sugiura |
| 2017/0171802 A1 | 6/2017 | Hou et al. |
| 2017/0179946 A1 | 6/2017 | Turvey |
| 2017/0195130 A1 | 7/2017 | Landow et al. |
| 2017/0212653 A1 | 7/2017 | Kanojia et al. |
| 2017/0230193 A1 | 8/2017 | Apte et al. |
| 2017/0244241 A1* | 8/2017 | Wilson ............... H01H 9/542 |
| 2017/0256934 A1 | 9/2017 | Kennedy et al. |
| 2017/0277709 A1 | 9/2017 | Strauss et al. |
| 2017/0314743 A1 | 11/2017 | Del Castillo et al. |
| 2017/0322049 A1 | 11/2017 | Wootton et al. |
| 2017/0338809 A1 | 11/2017 | Stefanov et al. |
| 2017/0347415 A1 | 11/2017 | Cho et al. |
| 2017/0366950 A1 | 12/2017 | Abron |
| 2018/0054862 A1 | 2/2018 | Takagimoto et al. |
| 2018/0061158 A1 | 3/2018 | Greene |
| 2018/0146369 A1 | 5/2018 | Kennedy, Jr. |
| 2018/0174076 A1 | 6/2018 | Fukami |
| 2018/0196094 A1 | 7/2018 | Fishburn et al. |
| 2018/0201302 A1 | 7/2018 | Sonoda et al. |
| 2018/0254959 A1 | 9/2018 | Mantyjarvi et al. |
| 2018/0285198 A1 | 10/2018 | Dantkale et al. |
| 2018/0287802 A1 | 10/2018 | Brickell |
| 2018/0301006 A1 | 10/2018 | Flint et al. |
| 2018/0307609 A1 | 10/2018 | Qiang et al. |
| 2018/0342329 A1 | 11/2018 | Rufo et al. |
| 2018/0359039 A1 | 12/2018 | Daoura et al. |
| 2018/0359223 A1 | 12/2018 | Maier et al. |
| 2019/0003855 A1 | 1/2019 | Wootton et al. |
| 2019/0020477 A1 | 1/2019 | Antonatos et al. |
| 2019/0028869 A1 | 1/2019 | Kaliner |
| 2019/0036928 A1 | 1/2019 | Meriac et al. |
| 2019/0050903 A1 | 2/2019 | DeWitt et al. |
| 2019/0052174 A1 | 2/2019 | Gong |
| 2019/0068716 A1 | 2/2019 | Lauer |
| 2019/0086979 A1 | 3/2019 | Kao et al. |
| 2019/0104138 A1 | 4/2019 | Storms et al. |
| 2019/0140640 A1 | 5/2019 | Telefus et al. |
| 2019/0165691 A1 | 5/2019 | Telefus et al. |
| 2019/0207375 A1 | 7/2019 | Telefus et al. |
| 2019/0238060 A1 | 8/2019 | Telefus et al. |
| 2019/0245457 A1 | 8/2019 | Telefus et al. |
| 2019/0253243 A1 | 8/2019 | Zimmerman et al. |
| 2019/0268176 A1 | 8/2019 | Pognant |
| 2019/0280887 A1 | 9/2019 | Telefus et al. |
| 2019/0306953 A1 | 10/2019 | Joyce et al. |
| 2019/0334999 A1 | 10/2019 | Ryhorchuk et al. |
| 2019/0355014 A1 | 11/2019 | Gerber |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0053100 A1 | 2/2020 | Jakobsson |
| 2020/0106259 A1 | 4/2020 | Telefus |
| 2020/0106260 A1 | 4/2020 | Telefus |
| 2020/0106637 A1 | 4/2020 | Jakobsson |
| 2020/0120202 A1 | 4/2020 | Jakobsson et al. |
| 2020/0145247 A1 | 5/2020 | Jakobsson |
| 2020/0153245 A1 | 5/2020 | Jakobsson et al. |
| 2020/0159960 A1 | 5/2020 | Jakobsson |
| 2020/0196110 A1 | 6/2020 | Jakobsson |
| 2020/0196412 A1 | 6/2020 | Telefus et al. |
| 2020/0275266 A1 | 8/2020 | Jakobsson |
| 2020/0287537 A1 | 9/2020 | Telefus et al. |
| 2020/0328694 A1 | 10/2020 | Telefus et al. |

FOREIGN PATENT DOCUMENTS

| | | |
|---|---|---|
| EP | 2560063 A1 | 2/2013 |
| GB | 2458699 A | 9/2009 |
| JP | 06-053779 A | 2/1994 |
| JP | 2013230034 A | 11/2013 |
| JP | 2014030355 A | 2/2014 |
| WO | 2010110951 A1 | 9/2010 |
| WO | 2016010529 A1 | 1/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2019133110 A1 | 7/2019 |
| WO | 2020014158 A1 | 1/2020 |
| WO | 2020014161 A1 | 1/2020 |
| WO | 2020072516 A1 | 4/2020 |
| WO | 2020131977 A1 | 6/2020 |

OTHER PUBLICATIONS

PCT/US19/67004, WO, Apr. 16, 2020, International Search Report and Written Opinion.

(56) References Cited

OTHER PUBLICATIONS

F. Stajano et al., "The Resurrecting Duckling: Security Issues for Ad-hoc Wireless Networks," International Workshop on Security Protocols, 1999, 11 pages.
L. Sweeney, "Simple Demographics Often Identify People Uniquely," Carnegie Mellon University, Data Privacy Working Paper 3, 2000, 34 pages.
A. Narayanan et al., "Robust De-anonymization of Large Sparse Datasets," IEEE Symposium on Security and Privacy, May 2008, 15 pages.
M. Alahmad et al., "Non-Intrusive Electrical Load Monitoring and Profiling Methods for Applications in Energy Management Systems," IEEE Long Island Systems, Applications and Technology Conference, 2011, 7 pages.
K. Yang et al. "Series Arc Fault Detection Algorithm Based on Autoregressive Bispecturm Analysis," Algorithms, vol. 8, Oct. 16, 2015, pp. 929-950.
J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.
S. Cuk, "98% Efficient Single-Stage AC/DC Converter Topologies," Power Electronics Europe, Issue 4, 2011, 6 pages.
E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.
C. Restrepo, "Arc Fault Detection and Discrimination Methods," 2007 Proceedings of the 53rd IEEE Holm Conference on Electrical Contacts, IEEE Explore Sep. 24, 2007, 8 pages.
K. Eguchi et al., "Design of a Charge-Pump Type AC-DC Converter for RF-ID Tags," 2006 International on Communications and Information Technologies, F4D-3, IEEE, 2006, 4 pages.
A. Ayari et al., "Active Power Measurement Comparison Between Analog and Digital Methods," International Conference on Electrical Engineering and Software Applications, 2013, 6 pages.
G. D. Gregory et al., "The Arc-Fault Circuit Interrupter, an Emerging Product," IEEE, 1998, 8 pages.
U.S. Appl. No. 16/720,446 filed in the name of Mark Telefus et al. Dec. 19, 2019, and entitled "Intelligent Circuit Breakers."
U.S. Appl. No. 16/720,485 filed in the name of Mark Telefus et al. Dec. 19, 2019, and entitled "Intelligent Circuit Breakers with Air-Gap and Solid-State Switches."
U.S. Appl. No. 16/720,506 filed in the name of Mark Telefus et al. Dec. 19, 2019, and entitled "Intelligent Circuit Breakers with Solid-State Bidirectional Switches."
U.S. Appl. No. 16/720,533 filed in the name of Mark Telefus et al. Dec. 19, 2019, and entitled"Intelligent Circuit Breakers with Detection Circuitry Configured to Detect Fault Conditions."
U.S. Appl. No. 16/720,583 filed in the name of Mark Telefus et al. Dec. 19, 2019, and entitled "Intelligent Circuit Breakers with Visual Indicators to Provide Operational Status."
U.S. Appl. No. 16/871,869 filed in the name of Bjorn Markus Jakobsson May 11, 2020, and entitled "Privacy Control and Enhancements for Distributed Networks."
U.S. Appl. No. 62/892,883 filed in the name of Bjorn Markus Jakobsson et al. Aug. 28, 2019, and entitled "Privacy and the Management of Permissions."
U.S. Appl. No. 62/900,951 filed in the name of Bjorn Markus Jakobsson et al. Sep. 16, 2019, and entitled "Performance, Privacy and Permissions."
U.S. Appl. No. 62/963,230 filed in the name of Bjorn Markus Jakobsson Jan. 20, 2020, and entitled "Infrastructure Support to Enhance Resource-Constrained Device Capabilities."
U.S. Appl. No. 62/964,078 filed in the name of Mark Telefus et al. Jan. 21, 2020, and entitled "Intelligent Power Receptacle with Arc Fault Circuit Interruption."
PCT/US20/33421, WO, Sep. 30, 2020, International Search Report and Written Opinion.
D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.
B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.
J. K. Becker et al., "Tracking Anonymized Bluetooth Devices," Proceedings on Privacy Enhancing Technologies, vol. 3, 2019, pp. 50-65.
H. Siadati et al., "Mind your SMSes: Mitigating Social Engineering in Second Factor Authentication," Computers & Security, vol. 65, Mar. 2017, 12 pages.
S. Jerde, "The New York Times Can Now Predict Your Emotions and Motivations After Reading a Story," https://www.adweek.com/tv-video/the-new-york-times-can-now-predict-your-emotions-and-motivations-after-reading-a-story/, Apr. 29, 2019, 3 pages.
K. Mowery et al., "Pixel Perfect: Fingerprinting Canvas in HTML5," Proceedings of W2SP, 2012, 12 pages.
S. Kamkar, "Evercookie," https://samy.pl/evercookie/, Oct. 11, 2010, 5 pages.
M. K. Franklin et al., "Fair Exchange with a Semi-Trusted Third Party," Association for Computing Machinery, 1997, 6 pages.
J. Camenisch et al., "Digital Payment Systems with Passive Anonymity-Revoking Trustees," Journal of Computer Security, vol. 5, No. 1, 1997, 11 pages.
L. Coney et al., "Towards a Privacy Measurement Criterion for Voting Systems," Proceedings of the 2005 National Conference on Digital Government Research, 2005, 2 pages.
L. Sweeney, "k-anonymity: A Model for Protecting Privacy," International Journal of Uncertainty, Fuzziness and Knowledge-Based Systems, vol. 1, No. 5, 2002, 14 pages.
C. Dwork, "Differential Privacy," Encyclopedia of Cryptography and Security, 2011, 12 pages.
A. P. Felt et al., "Android Permissions: User Attention, Comprehension, and Behavior," Symposium on Usable Privacy and Security, Jul. 11-13, 2012, 14 pages.
S. Von Solms et al., "On Blind Signatures and Perfect Crimes," Computers & Security, vol. 11, No. 6, 1992, 3 pages.
R. Wyden, "Wyden Releases Discussion Draft of Legislation to Provide Real Protections for Americans' Privacy," https://www.wyden.senate.gov/news/press-releases/wyden-releases-discussion-draft-of-legislation-to-provide-real-protections-for-americans-privacy, Nov. 1, 2018, 3 pages.
M. Rubio, "Rubio Introduces Privacy Bill to Protect Consumers While Promoting Innovation," https://www.rubio.senate.gov/public/index.cfm/2019/1/rubio-introduces-privacy-bill-to-protect-consumers-while-promoting-innovation#:%7E:text=Washingt%E2%80%A6, Jan. 16, 2019, 2 pages.
C. Dwork et al., "Differential Privacy and Robust Statistics," 41st ACM Symposium on Theory of Computing, 2009, 10 pages.
J. Camenisch et al., "Compact E-Cash," Eurocrypt, vol. 3494, 2005, pp. 302-321.
D. L. Chaum, "Untraceable Electronic Mail, Return Addresses, and Digital Pseudonyms," Communications of the ACM, vol. 24, No. 2, Feb. 1981, pp. 84-88.
J. Camenisch et al., "An Efficient System for Nontransferable Anonymous Credentials With Optional Anonymity Revocation," International Conference on the Theory and Application of Cryptographic Techniques, May 6-10, 2001, 30 pages.
M. K. Reiter et al., "Crowds: Anonymity for Web Transactions," ACM Transactions on Information and System Security, vol. 1, 1997, 23 pages.
I. Clarke et al., "Freenet: A Distributed Anonymous Information Storage and Retrieval System," International Workshop on Designing Privacy Enhanching Technologies: Design Issues in Anonymity and Unobservability, 2001, 21 pages.
P. Golle et al., "Universal Re-encryption for Mixnets," Lecture Notes in Computer Science, Feb. 2004, 15 pages.
Y. Lindell et al., "Multiparty Computation for Privacy Preserving Data Mining," Journal of Privacy and Confidentiality, May 6, 2008, 39 pages.

(56) References Cited

OTHER PUBLICATIONS

J. Hollan et al., "Distributed Cognition: Toward a New Foundation for Human-Computer Interaction Research," ACM Transactions on Computer-Human Interaction, vol. 7, No. 2, Jun. 2000, pp. 174-196.
A. Adams et al., "Users are Not the Enemy," Communications of the ACM, Dec. 1999, 6 pages.
A. Morton et al., "Privacy is a Process, Not a Pet: a Theory for Effective Privacy Practice," Proceedings of the 2012 New Security Paradigms Workshop, Sep. 2012, 18 pages.
G. D. Abowd et al., "Charting Past, Present and Future Research in Ubiquitous Computing," ACM Transactions on Computer-Human Interaction, vol. 7, No. 1, Mar. 2000, pp. 29-58.
W. Mason et al., "Conducting Behavioral Research on Amazon's Mechanical Turk," Behavior Research Methods, Jun. 2011, 23 pages.
G. M. Gray et al., "Dealing with the Dangers of Fear: The Role of Risk Communication," Health Affairs, Nov. 2002, 11 pages.
U.S. Appl. No. 17/005,949 filed in the name of Bjorn Markus Jakobsson et al. Aug. 28, 2020, and entitled "Privacy and the Management of Permissions."
U.S. Appl. No. 17/032,759 filed in the name of Mark D. Telefus et al. Sep. 25, 2020, and entitled "AC-Driven Light-Emitting Diode Systems."
U.S. Appl. No. 63/064,399 filed in the name of Mark Telefus et al. Aug. 11, 2020, and entitled "Energy Traffic Monitoring and Control System."
U.S. Appl. No. 17/047,613 filed in the name of Mark Telefus et al. Oct. 14, 2020, and entitled "Intelligent Circuit Breakers."

\* cited by examiner

CIRCUIT INTERRUPTER WITH OPTICAL CONNECTION

FIELD OF INVENTION

The invention relates to circuit interrupters, and particularly, to optically coupled circuit interrupters.

BACKGROUND OF INVENTION

A conventional circuit interrupter serves to interrupt power connections to electrical loads. However, conventional circuit interrupters, particularly those designed using electro-mechanical relays with air gaps, suffer unreliable operation due to various environmental interferences, for example, from oxidation, dust, dirt and other physical interferences. There is a need, therefore, for an improved circuit interrupter solution characterized by arc-free and fast switching.

Background publications on solid state circuit interrupters include U.S. Pat. No. 4,245,184 wherein a mechanical toggle control switch is included. U.S. Pat. No. 7,633,727 teaches band pass filters cooperating with a current sensor. U.S. Pat. No. 7,948,719 discloses a solid state device and a control for opening the circuit functioning as a protection switch. U.S. Pat. No. 9,774,182 discloses a solid state series switch positioned between a high voltage, direct current bus and a high voltage DC power source wherein the series switch is configured to establish an open circuit upon receiving an electrical signal. Additional background materials are found in U.S. Pat. Nos. 4,245,185; 6,167,329; 6,788,512; 8,718,830; 9,774,182; 6,141,197; U.S.20080204950; U.S.20100091418; U.S.20100156369; U.S.20100244730; U.S.20100320840; U.S.20130066478; U.S.20130253898; U.S.20140085940; U.S.20150097430; U.S.20160294179; and U.S.20170256934; all cited background literature is incorporated herein in its entirety by reference. The literature contains no suggestion or reference to the use of optical coupling in a circuit interrupter.

SUMMARY

In an exemplary embodiment, a circuit interrupter positioned between a supply circuit and a load circuit comprises fault detection and over-current demand circuits for sensing wave forms to the load circuit, a fault processing circuit for detecting presence of faults and generating fault output signals when a fault is detected, and a control circuit switch connected to fault processing signal output, wherein control circuit switch is opened by presence of fault output signal, thus isolating load circuit from supply circuit. Optionally, fault processing circuit and control circuit are optically linked, such that when fault is detected, control circuit switch is opened by optical fault output signal, thus isolating load circuit from the supply circuit. A circuit interrupter may couple with one or more circuit interrupters via power distribution control unit, optionally manageable remotely via automated control interface. In some embodiments a circuit interrupter may be remotely directed to open circuit or close circuit via communication from a power distribution network in communication with an automated control interface.

DETAILED DESCRIPTION

A circuit interrupter positioned between a supply circuit and a load circuit includes a fault detection circuit that senses wave forms to the load circuit, a fault processing circuit that detects the presence of a fault and generates a fault output signal when a fault detected, and a control circuit switch connected to the fault processing circuit, wherein the control circuit switch is activated in response to the fault output signal, thus isolating the load circuit from the supply circuit.

In some embodiments, a circuit interrupter is optically linked to a control circuit, such that when a fault is detected, an optical control circuit switch of the circuit interrupter is activated by an optical signal, thus isolating load circuit from the supply circuit.

A circuit interrupter can be coupled to another circuit interrupter via a power distribution control unit, wherein the power distribution control unit may be configured, optionally, to be managed remotely via automated control interface.

Figure 1A:
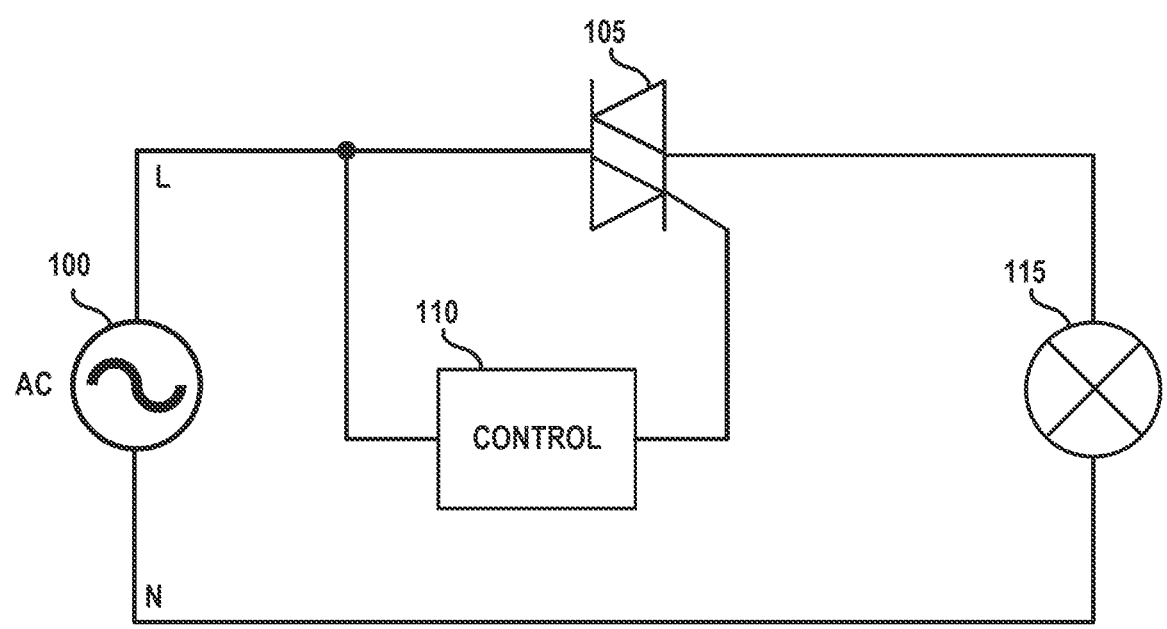
FIGS. 1A, 1B, and 1C schematically illustrate prior art circuit interrupters.
Figure 1B:
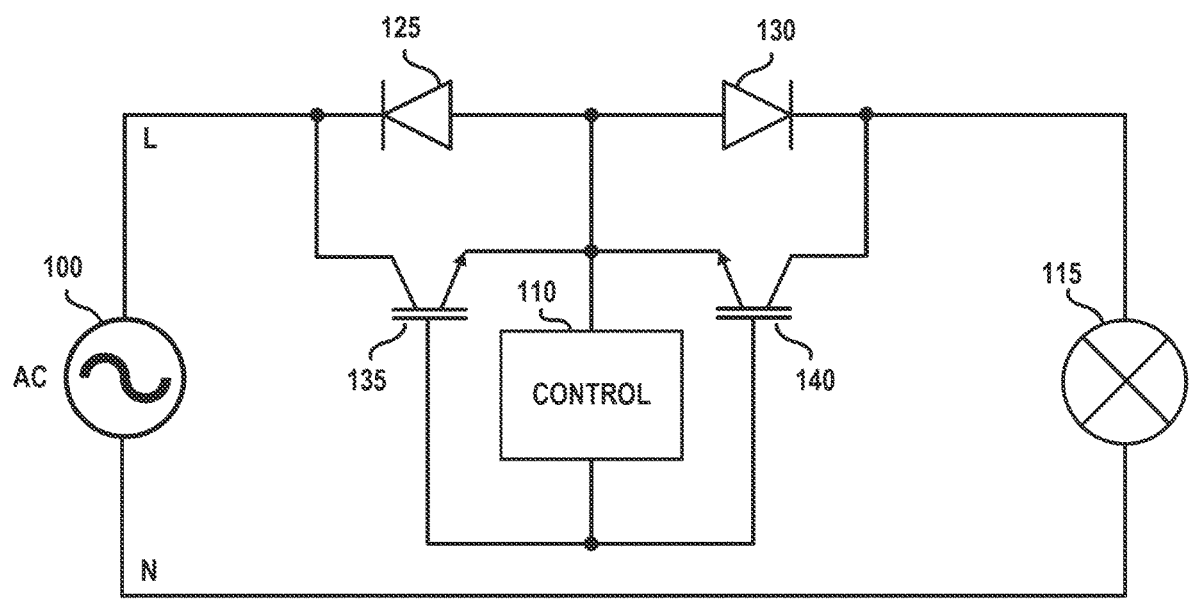
Figure 1C:
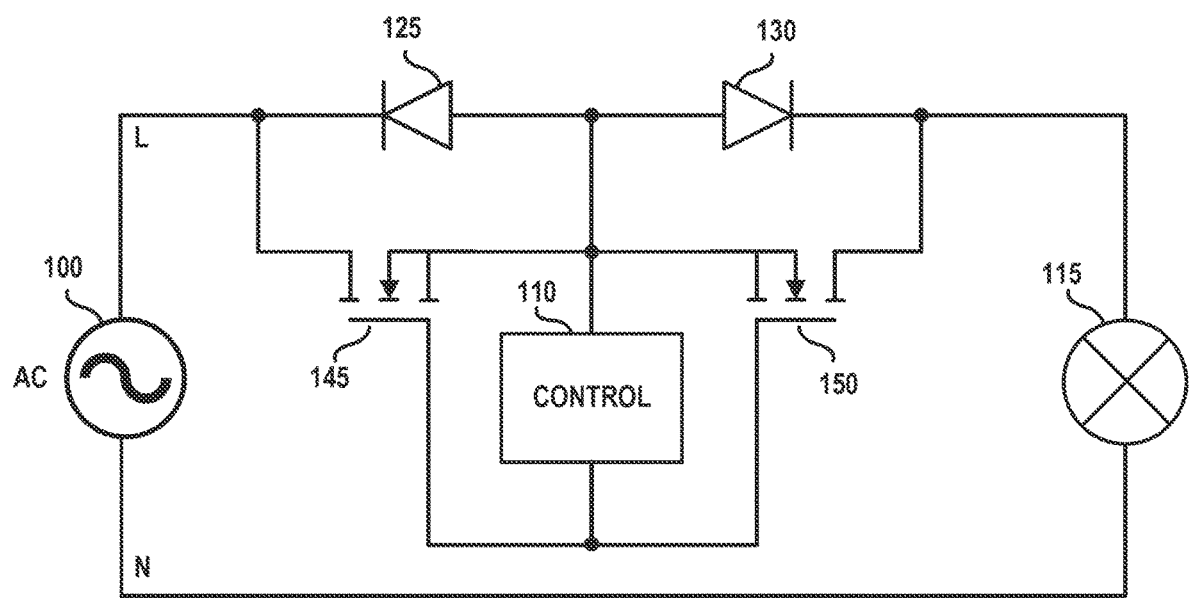
Figure 2:
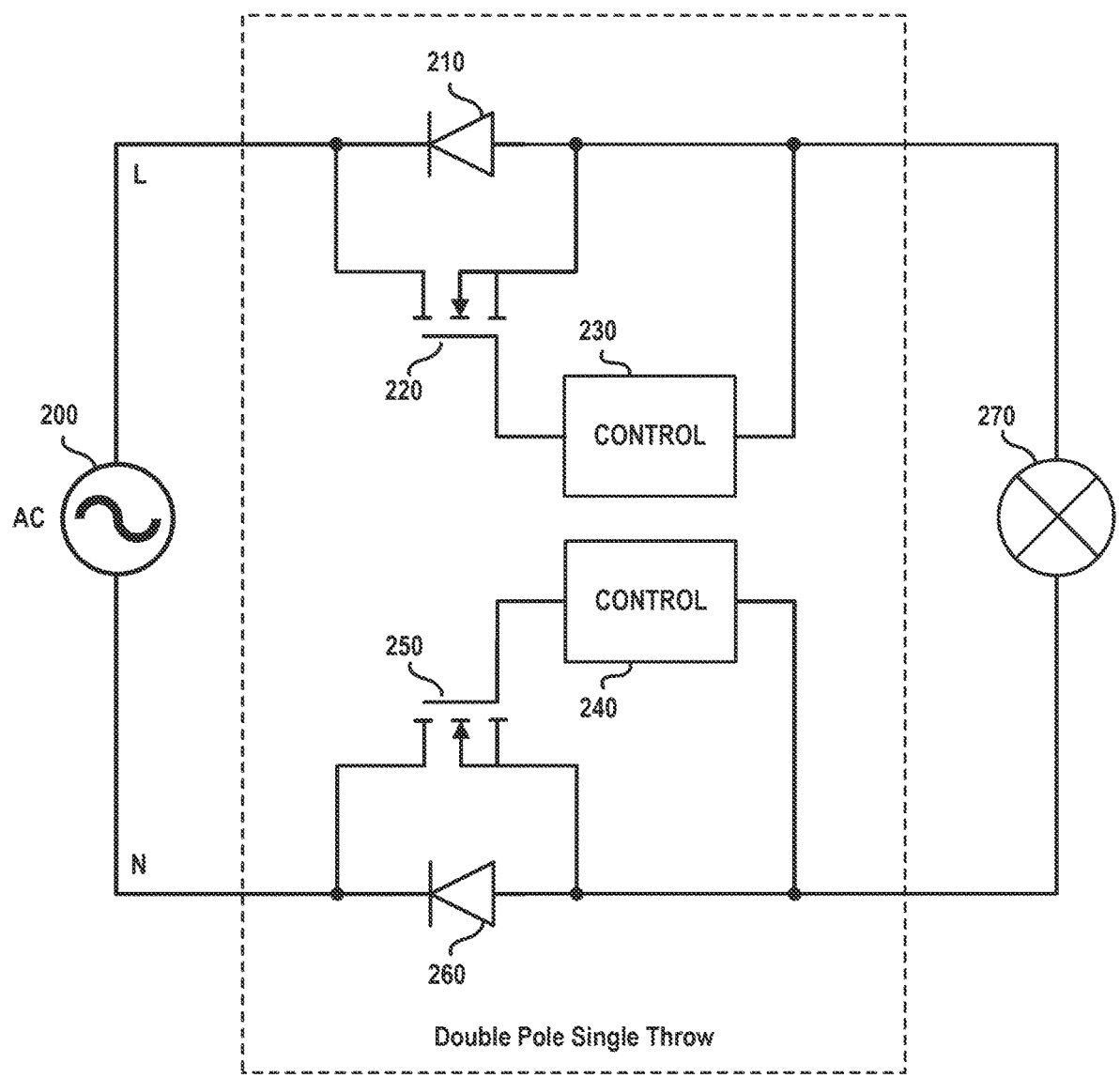
FIG. 2 schematically illustrates a solid-state circuit interrupter according to one or more aspects of the present invention.
Figure 3:
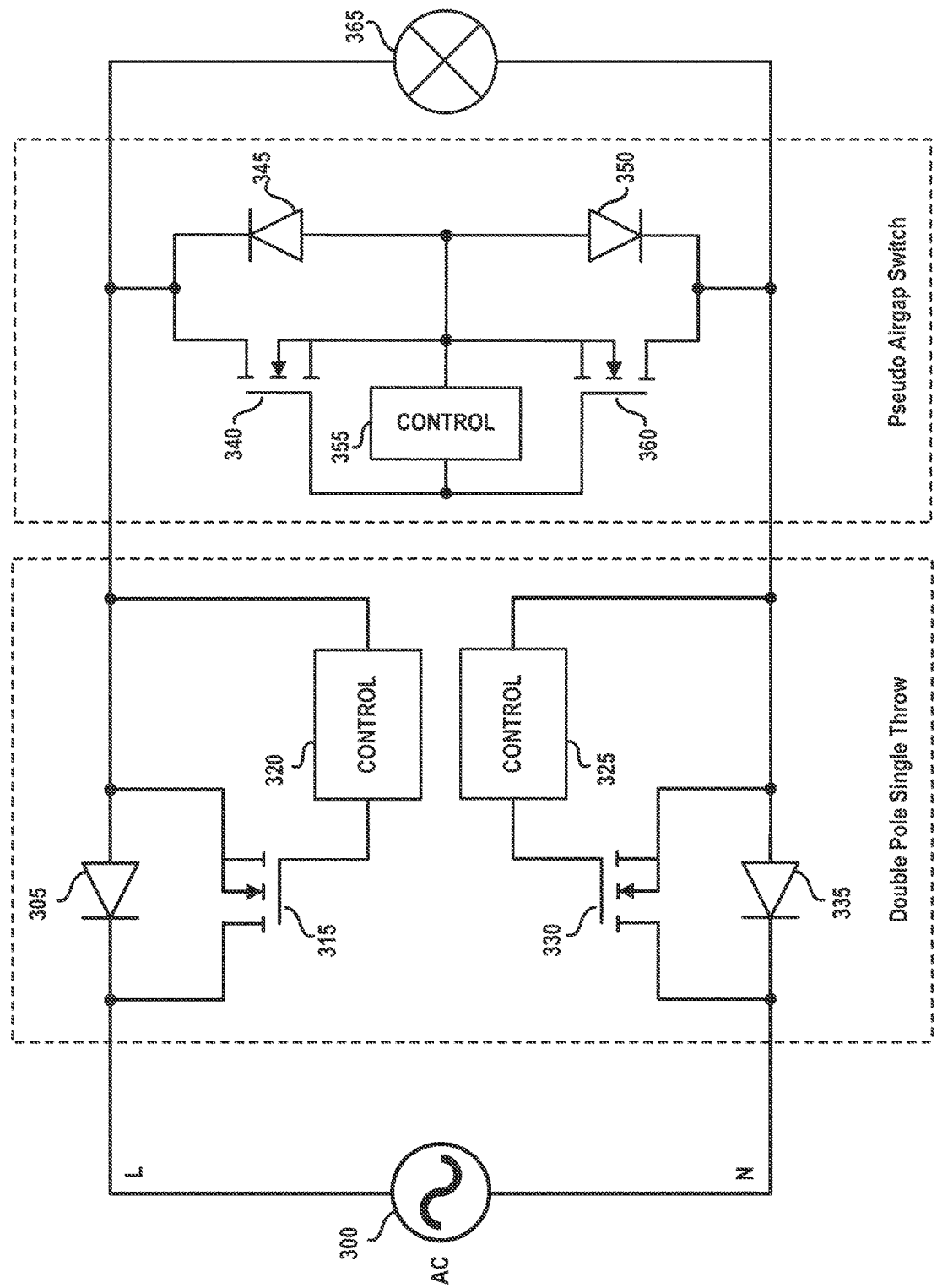
FIG. 3 schematically illustrates a solid-state circuit interrupter according to one or more aspects of the present invention.
Figure 4:
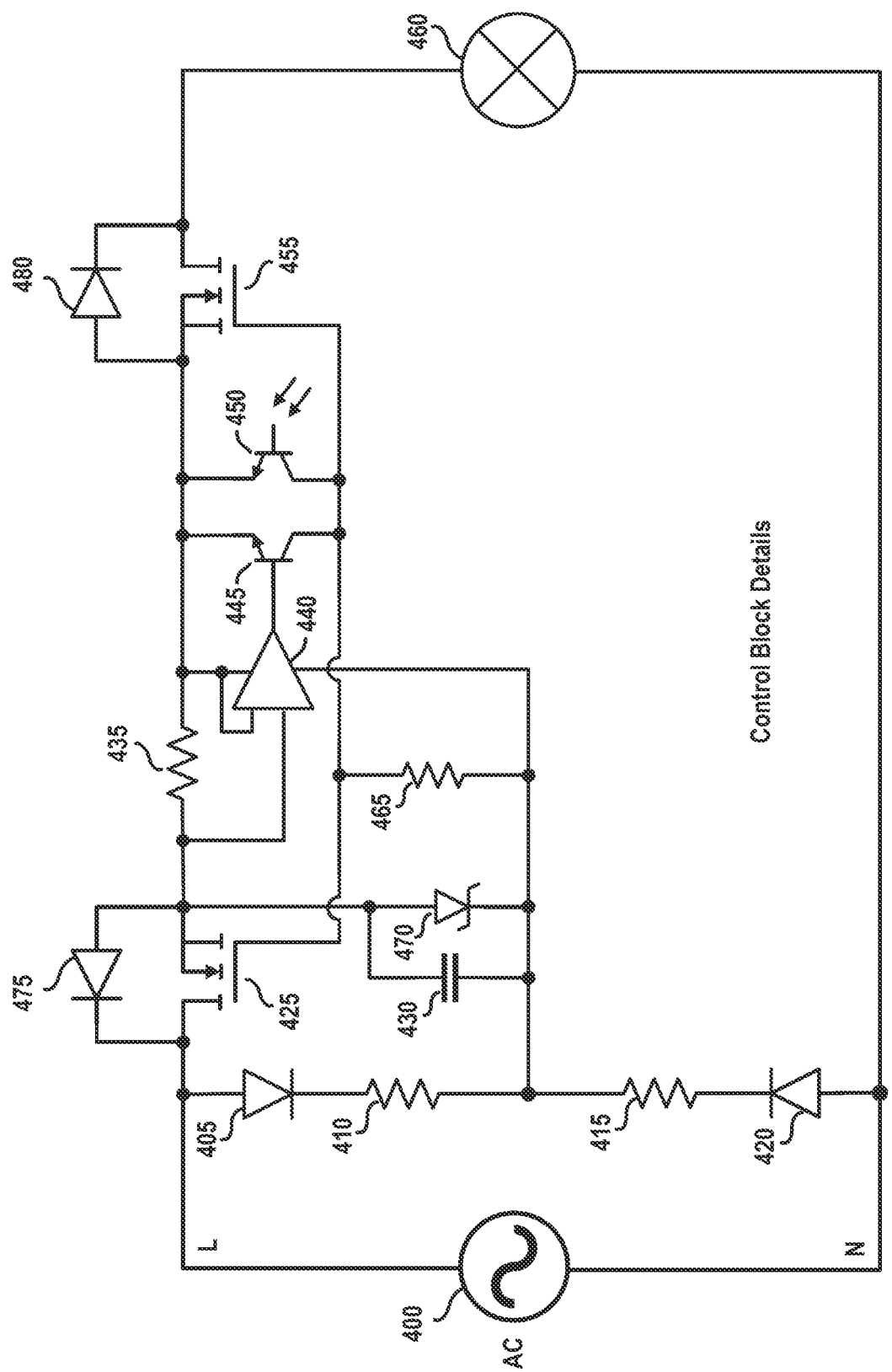
FIG. 4 schematically illustrates a solid-state circuit interrupter according to one or more aspects of the present invention.
Figure 5:
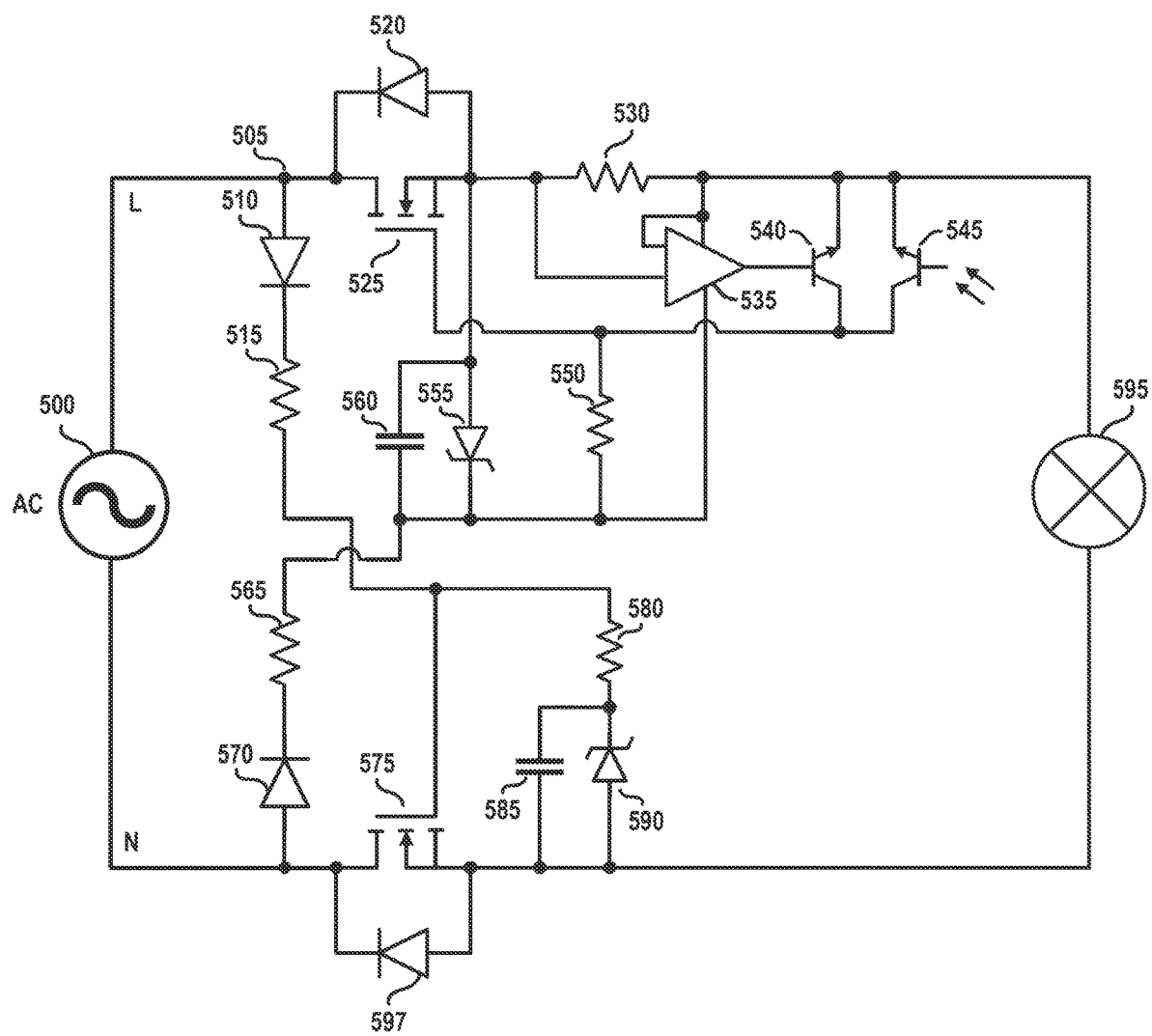
FIG. 5 schematically illustrates a solid-state circuit interrupter according to one or more aspects of the present invention.

FIGS. 1A, 1B, and 1C schematically illustrate various embodiments of the prior art, none of which have an optical coupling. FIG. 2 is one example of a double pole, single throw circuit interrupter. FIG. 3 is one example of a double pole, single throw circuit interrupter with a "pseudo air gap switch" (alternatively referred to as an "Amber crowbar"). FIG. 4 is one example of a single pole, single throw circuit interrupter. FIG. 5 is one example of a double pole, double throw circuit interrupter.

As used herein, a fault detection circuit sensing waveforms includes the ability to sense over-current conditions, over-voltage conditions, including ground-fault and arc-fault conditions, and then signal which condition is faulting. In addition, when the control circuit switch is opened by the presence of a fault processing signal output thus isolating the load circuit from the supply circuit in some embodiments the control circuit is not isolated from the supply circuit. In the embodiments where a constant optical signal is required, the control circuit is not isolated from the supply circuit when the optical signal is not present. One knowledgeable in the art understands the need for and why a lock-out/tag-out capability is required.

FIG. 1A schematically illustrates a simple power controller. In this art, power is controlled by the controller 110 which controls a TRIAC 105. When released by the source 100, the controller 110 may allow the power through by activating the TRIAC 105 or not, thus allowing power to flow to load 115 or not.

FIG. 1B schematically illustrates a circuit interrupter in which the controller 110 controls the flow of electricity by controlling two solid state bipolar junction transistors 135 and 140 through a connection to the base terminals of the bipolar junction transistors 135 and 140. These two power BJT's 135 and 140 allow for the power from source 100 to flow through them to power the load circuit 115. Each BJT 135 and 140 has a diode connected in parallel with it, wherein the BJT 135 is connected in parallel with diode 125, and the BJT 140 is connected in parallel with diode 130.

FIG. 1C schematically illustrates a circuit interrupter which utilizes two power MOSFETs 145 and 150. Here, the power flows from the source 100 through the MOSFET 145 when the controller turns the MOSFET 145 on and the wave is in the positive part of its cycle. The wave then moves through the diode 130 and the power is then transferred to the load 115. In the negative part of the power cycle, the controller 110 turns the MOSFET 150 on so that power will flow through the MOSFET 150 and the diode 125. The diodes 125 and 130 in FIG. 1C represent internal parasitic diodes of the MOSFETs 145 and 150, respectively, and are illustrated to show functionality. Diodes may also be physically added, but doing so is unneeded.

FIG. 2 schematically illustrates an exemplary embodiment of a Double Pole Single Throw circuit interrupter. FIG. 2 illustrates an AC source 200, two power MOSFETs 220 and 250 which are connected to respective controllers 230 and 240, a load 270, and two diodes 210 and 260 which represent internal parasitic diodes of the MOSFETs 220 and 250, respectively.

The embodiment features two controllers 230 and 240 which control the configuration of the circuit on either the positive or negative part of the wave emanating from the power source 200. On the positive part of the wave, the controller 230 sends a signal to the gate of the power MOSFET 220 turning the MOSFET 220 on. The wave travels through the MOSFET 220, through the load circuit 270 and returns to the source through the diode 260. On the negative part of the wave, the controller 240 turns the MOSFET 250 on through its gate. The wave then travels through the MOSFET 250, through the load circuit 270, and returns to the source 200 through the diode 210. FIG. 2 illustrates a method to greatly reduce the current flowing to the load but does not reduce the current flowing to load to 0. A true air gap circuit by definition would reduce the current to load to 0, therefore there is a need for improvement to the double pole single throw circuit.

FIG. 3 schematically illustrates a solid-state circuit interrupter which is similar to FIG. 2, but which further includes a pseudo airgap switch circuit (or the "Amber Crowbar") which is placed between the load and the double pole single throw circuit. The basic function of the pseudo airgap switch circuit is to short (or shunt) the load circuit 365 when the double pole single throw circuit is off, thus allowing any signal to bypass the load circuit 365 and protecting the load circuit 365 by reducing the current (e.g., leakage current) to the load to zero when the double pole single throw circuit is off. This improvement makes the solid-state power device have a true airgap without the introduction of electromechanical devices. The pseudo airgap switch circuit comprises a controller 355 which controls two power MOSFETs 340 and 360. When a problematic wave seeks to enter the load circuit, the "Amber Crowbar" circuit activates. On the positive wave cycle, the MOSFET 340 is activated by the controller 355. The wave passes through the MOSFET 340 and diode 350 and returns to the source 300 safely avoiding the load circuit 365. On the negative cycle, the MOSFET 360 is activated by the controller 355. The wave passes through the MOSFET 360 and diode 345 and returns to the source 300 safely avoiding the load circuit 365. As in other embodiments discussed herein, the diodes 345 and 350 represent internal parasitic diodes of the respective MOSFETs 340 and 360, but can include actual diode components, although doing so is redundant.

In some embodiments, a circuit interrupter is positioned between a supply circuit and a load circuit comprises a fault detection circuit sensing wave forms to the load circuit; a fault processing circuit for detecting the presence of a fault and generating a fault output signal when a fault is detected; and a control circuit switch connected to the fault processing signal output wherein the control circuit switch is opened by the presence of the fault output signal thus isolating the load circuit from the supply circuit; optionally a circuit interrupter has a fault processing circuit and the control circuit optically linked such that when a fault is detected the control circuit switch is opened by the optical fault output signal thus isolating the load circuit from the supply circuit; optionally a circuit interrupter is coupled to another circuit interrupter via a power distribution control unit; optionally a circuit interrupter comprises a power distribution control unit manageable remotely via an automated control interface.

In some embodiments a circuit interrupter positioned between a supply circuit and a load circuit comprises a fault detection circuit sensing wave forms to the load circuit; a fault processing circuit for detecting the presence of a fault and generating an optical fault output signal when a fault is detected; and a control circuit switch optically connected to the fault processing signal output wherein the switch is opened by the presence of the fault output signal isolating the load circuit from the supply circuit; optionally, a circuit interrupter is coupled to another circuit interrupter via a power distribution control unit; optionally, a circuit interrupter is coupled to a power distribution control unit manageable remotely via an automated control interface.

In some embodiments a circuit interrupter method comprises the steps of sensing by a fault detection circuit wave forms to a load circuit; of detecting by a fault processing circuit presence of a fault; and of generating by the fault processing circuit an optical fault output signal when a fault is detected; wherein a control circuit switch is optically connected to the fault processing signal output, such that the switch is opened by the presence of the fault output signal isolating the load circuit from a supply circuit; optionally, the step of coupling to another circuit interrupter via a power distribution control unit; optionally, the power distribution control unit is manageable remotely via an automated control interface.

In some embodiments a circuit interrupter positioned between a supply circuit and a load circuit comprises a fault detection circuit sensing wave forms to the load circuit; a fault processing circuit for detecting the presence of a fault and generating a fault output signal when a fault is detected; and wherein the fault processing circuit and the control circuit must be optically linked for continuous operation such that when a fault is detected the control circuit switch is opened by the absence of an optical signal thus isolating the load circuit from the supply circuit; optionally, a circuit interrupter comprises a fault processing circuit and control circuit optically linked but physically separated from each other such that a physical object may be inserted between them blocking the optical link; optionally, a circuit interrupter comprises a physical object is a portion of a lockout/tag-out mechanism that is configured to render the circuit interrupter in a state wherein current can not flow from the supply circuit to the load circuit.

In some embodiments an apparatus comprises a plurality of circuit interrupters, each positioned between a supply circuit and a load circuit wherein the apparatus comprises a power distribution control unit and is manageable remotely via an automated control interface.

FIG. 4 schematically illustrates a solid-state circuit interrupter according to an exemplary embodiment. For example, FIG. 4 illustrates an exemplary embodiment for implementing a controller as shown in the embodiments of FIGS. 2 and 3. In the exemplary embodiment of FIG. 4, the control block comprises a source connection 400, a load 460, MOSFETS 425 and 455, internal parasitic diodes 475 and 480 of the MOSFETs 425 and 455, respectively, two diodes 405 and 420, a voltage reference that is generated by a Zener diode 470 and a capacitor 430. Additionally, there are 4 resistors 410, 415, 465 and 435. An operational amplifier 440 is connected to a BJT 445 which is mirrored to an optically controlled phototransistor 450 all of which control the operation of the MOSFET 425 and MOSFET 455. FIG. 5 schematically illustrates a solid-state circuit interrupter according to another exemplary embodiment. For example, FIG. 5 illustrates another exemplary embodiment for implementing a controller as shown in the embodiments of FIGS. 2 and 3. The embodiment of FIG. 5 comprises 4 diodes 510, 520, 570 and 597, two MOSFETs 525 and 575, a BJT 540, and a phototransistor 545. The embodiment of FIG. 5 further comprises two Zener diodes 555 and 590 that are connected in parallel with respective capacitors 560 and 585, to provide clamping circuits that generate voltage references to drive the MOSFETs 525 and 575. Finally, there is an operational amplifier 535 which functions as a controller for the BJT 540. Additionally, one embodiment may include a programable chip inside of the controller for further control over the power functions.

The controller's main function is to convert AC power to DC by using of switching. This process starts with the configuration of the controller by applying a photo source to phototransistor 545. The optical signal (denoted by the arrows directed to the phototransistor 545) can enter through a device such as a connected fiber optics cable, but other methods and devices work as well. Optionally, the phototransistor 545 can be replaced by a more typical power BJT, but the preferred embodiment includes the phototransistor 545.

When turned on, the optical transistor 545 stays on until the rest of the controller is set. Essentially, the phototransistor 545 begins an initialization state for a few cycles of applied AC power around a few hundred milliseconds, but this can be tuned for faster or slower startup speeds. With the addition of an optional control block, the optical transistor 545 can be used as a means for control of the controller or other added function with use of control blocks.

This process starts with the AC source 500 emitting power. On the positive part of the cycle, the wave travels to the first node marked 505. Then, the wave enters the diode 510 and passes over resistor 515. Next, the wave begins to charge the capacitor 585 and Zener diode 590 pair after passing over resistor 580. This pair functions as a gate driver which will turn the power MOSFET 575 on for the next cycle. On the negative part of the first cycle, the wave passes over the diode 570 and the resistor 565 to charge the Zener diode 555 and the capacitor 560 pair, which like the other pair functions as a gate source driver to drive the power MOSFET 525. Additionally, this negative part of the wave enters the comparator 535 serving as the V− for proper comparator function.

The next cycle begins with each of the power MOSFETS 525 and 575 turned on. The positive cycle of the wave is first. Here, the wave passes through the MOSFET 525 and then across the resistor 530. The voltage across the resistor 530 is measured by the comparator 535. If the voltage closest to the MOSFET is less than the voltage of that at the rightmost end of the resistor 530, the comparator 535 turns on and effectively clamps the circuit by turning on the BJT 540, resulting in shunting the current away from the load and deactivating the MOSFET 525. If the wave is not shunted, then it begins entering the load 595. The wave then exits the load 595 and enters the anode of the diode 597 and exits the cathode and returns to the source 500.

On the negative part of the wave, the wave passes through the MOSFET 575, enters the load 595, and then exits it. Then, the wave enters the anode of diode 520 exits the cathode and returns to the source.

The overall function of the circuit allows for controlled delivery of power to the load 595 with control along the way by means of the operational amplifier 535 and the phototransistor 545.

Foregoing descriptions of specific embodiments of the invention have been presented for purposes of illustration and description. They are not intended to be exhaustive or to limit the invention to the precise forms disclosed. Modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

The invention claimed is:

1. A circuit interrupter comprising:
   a solid-state switch serially connected between a line input terminal and a load output terminal of the circuit interrupter, and configured to be placed in one of (i) a switched-on state to provide an electrical connection in an electrical path between the line input terminal and the load output terminal, and (ii) a switched-off state;
   switch control circuitry configured to control the solid-state switch, wherein the switch control circuitry comprises:
   a driver circuit configured to generate a drive voltage using current drawn from an input power source applied to the line input terminal of the circuit interrupter, wherein the drive voltage is applied to a control input of the solid-state switch to place the solid-state switch in the switched-on state;
   a fault detection circuit configured to (i) sense a voltage level across a sense resistor which is serially connected with the solid-state switch in the electrical path between the line input terminal and the load output terminal and (ii) generate a fault output signal in response to detecting a fault condition based on the sensed voltage level across the sense resistor;
   a control switch connected to the fault detection circuit and configured to place the solid-state switch in the switched-off state, in response to the fault output signal generated by the fault detection circuit; and
   an optical switch configured to place the solid-state switch in the switched-off state, in response to an optical control signal applied to the optical switch.

2. The circuit interrupter of claim 1, wherein said circuit interrupter is coupled to at least one other circuit interrupter via a power distribution control unit.

3. The circuit interrupter of claim 2, wherein the power distribution control unit is configured to be managed remotely via an automated control interface.

4. The circuit interrupter of claim 1, wherein the solid-state switch comprises a first MOSFET switch and a second MOSFET switch serially connected between the line input terminal and the load output terminal of the circuit interrupter, wherein the sense resistor is serially connected between the first and second MOSFET switches.

5. The circuit interrupter of claim 1, wherein the driver circuit comprises a voltage clamping circuit configured to generate the drive voltage to drive the solid-state switch.

6. The circuit interrupter of claim 5, wherein the clamping circuit comprises a capacitor and a Zener diode connected in parallel.

7. The circuit interrupter of claim 1, wherein the fault detection circuit comprises an operational amplifier having first and second input terminals connected across the sense resistor, and an output terminal connected to the control switch.

8. The circuit interrupter of claim 7, wherein the control switch comprises a bipolar junction transistor device having a base terminal connected to the output terminal of the operational amplifier.

9. The circuit interrupter of claim 1, wherein the optical switch comprises a phototransistor device.

10. The circuit interrupter of claim 1, further comprising an isolation circuit which is configured to shunt leakage current away from a load circuit connected to the circuit interrupter, when the solid-state switch is in the switched-off state.

11. A method, comprising:
controlling a solid-state switch, which is serially connected between a line input terminal and a load output terminal of a circuit interrupter, to place the solid-state switch in one of (i) a switched-on state to provide an electrical connection in an electrical path between the line input terminal and the load output terminal of the circuit interrupter, and (ii) a switched-off state;
wherein controlling the solid-state switch comprises:
generating a drive voltage using current drawn from an input power source applied to the line input terminal of the circuit interrupter;
applying the drive voltage to a control input of the solid-state switch to place the solid-state switch in the switched-on state;
sensing a voltage level across a sense resistor which is serially connected with the solid-state switch in the electrical path between the line input terminal and the load output terminal;
generating a fault output signal in response to detecting a fault condition based on the sensed voltage level across the sense resistor; and
placing the solid-state switch in the switched-off state, in response to generating the fault output signal; and
wherein controlling the solid switch further comprises:
applying an optical control signal to activate an optical switch of the circuit interrupter; and
placing the solid-state switch in the switched-off state, in response to the activation of the optical switch.

12. The method of claim 11, wherein generating the drive voltage using current drawn from the input power source applied to the line input terminal of the circuit interrupter comprises charging a clamping circuit to generate the drive voltage to drive the solid-state switch.

13. The method of claim 11, wherein:
sensing the voltage level across the sense resistor comprises applying the sensed voltage level across first and second input terminals of an operational amplifier; and
generating the fault output signal comprises the operational amplifier generating the fault output signal and outputting the fault output signal, in response to detecting a fault condition based on the sensed voltage level across the sense resistor.

14. The method of claim 11, wherein placing the solid-state switch in the switched-off state, in response to generating the fault output signal, comprises activating a control switch in response to the fault output signal, wherein activation of the control switch results in deactivation of the solid-state switch.

15. The method of claim 11, further comprising activating an isolation circuit to shunt leakage current away from a load circuit connected to the circuit interrupter, in response to solid-state switch being placed in the switched-off state.

16. A circuit interrupter, comprising:
a first solid-state switch serially connected between a first line input terminal and a first load output terminal of the circuit interrupter, and configured to be placed in one of (i) a switched-on state to provide an electrical connection in a first electrical path between the first line input terminal and the first load output terminal, and (ii) a switched-off state;
a second solid-state switch serially connected between a second line input terminal and a second load output terminal of the circuit interrupter, and configured to be placed in one of (i) a switched-on state to provide an electrical connection in a second electrical path between the second line input terminal and the second load output terminal, and (ii) a switched-off state;
switch control circuitry configured to control the first and second solid-state switches, wherein the switch control circuitry comprises:
a first driver circuit configured to generate a first drive voltage using current drawn from an input power source applied to the first and second line input terminals of the circuit interrupter, wherein the first drive voltage is applied to a control input of the first solid-state switch to place the first solid-state switch in the switched-on state;
a second driver circuit configured to generate a second drive voltage using current drawn from the input power source applied to the first and second line input terminals of the circuit interrupter, wherein the second drive voltage is applied to a control input of the second solid-state switch to place the second solid-state switch in the switched-on state;
a fault detection circuit configured to (i) sense a voltage level across a sense resistor which is serially connected with the first solid-state switch in the first electrical path between the first line input terminal and the first load output terminal and (ii) generate a fault output signal in response to detecting a fault condition based on the sensed voltage level across the sense resistor;
a control switch connected to the fault detection circuit and configured to place the solid-state switch in the switched-off state, in response to the fault output signal generated by the fault detection circuit; and
an optical switch configured to place the first solid-state switch in the switched-off state, in response to an optical control signal applied to the optical switch.

17. The circuit interrupter of claim 16, wherein the fault detection circuit comprises an operational amplifier having first and second input terminals connected across the sense resistor, and an output terminal connected to the control switch.

18. The circuit interrupter of claim 17, wherein the control switch comprises a bipolar junction transistor device having a base terminal connected to the output terminal of the operational amplifier.

19. The circuit interrupter of claim 16, wherein the optical switch comprises a phototransistor device.

20. The circuit interrupter of claim 16, further comprising an isolation circuit which is configured to shunt leakage current away from a load circuit connected to the circuit interrupter, when at least the first solid-state switch is in the switched-off state.

\* \* \* \* \*